(12) United States Patent
Akbari-Dilmaghai (10) Patent No.: US 11,927,644 B2
(45) Date of Patent: Mar. 12, 2024

(54) CIRCUIT FAILURE DETECTION FOR DIODE ARRAYS

(71) Applicant: ams AG, Premstaetten (AT)

(72) Inventor: Rahim Akbari-Dilmaghai, Eindhoven (NL)

(73) Assignee: AMS AG, Premstaetten (AT)

( * ) Notice: Subject to any disclaimer, the term of this patent is extended or adjusted under 35 U.S.C. 154(b) by 386 days.

(21) Appl. No.: 17/415,362

(22) PCT Filed: Dec. 6, 2019

(86) PCT No.: PCT/EP2019/084091
§ 371 (c)(1),
(2) Date: Jun. 17, 2021

(87) PCT Pub. No.: WO2020/126574
PCT Pub. Date: Jun. 25, 2020

(65) Prior Publication Data
US 2022/0065947 A1   Mar. 3, 2022

Related U.S. Application Data

(60) Provisional application No. 62/825,395, filed on Mar. 28, 2019, provisional application No. 62/782,067, filed on Dec. 19, 2018.

(51) Int. Cl.
*G01R 31/52* (2020.01)
*G01R 31/54* (2020.01)
(Continued)

(52) U.S. Cl.
CPC ............. *G01R 31/52* (2020.01); *G01R 31/54* (2020.01); *G01S 7/497* (2013.01); *H01S 5/0014* (2013.01);
(Continued)

(58) Field of Classification Search
None
See application file for complete search history.

(56) References Cited

U.S. PATENT DOCUMENTS

2002/0014851 A1   2/2002   Tai et al.
2004/0212867 A1*  10/2004  Self ..................... H03F 3/45183
                                                 359/245
(Continued)

FOREIGN PATENT DOCUMENTS

CN   104507243 A   4/2015
CN   107407890 A   11/2017
(Continued)

OTHER PUBLICATIONS

CN 1st Office Action for corresponding CN Application No. 201980084463. 1, dated Jun. 24, 2023, pp. 1-9.

*Primary Examiner* — Jermele M Hollington
(74) *Attorney, Agent, or Firm* — TAROLLI, SUNDHEIM, COVELL & TUMMINO L.L.P.

(57) ABSTRACT

An apparatus and method for circuit failure detection for a diode array. The apparatus includes a diode array, a diode array test circuit electrically coupled to the diode array and operable to perform circuit failure detection during a test mode when a test input voltage is applied, the diode array test circuit includes an input resistor, an input voltage node, a buffered amplifier circuit, and a plurality of amplifier circuit switches. The apparatus further includes a current detector electrically coupled to the output of the buffered amplifier circuit and operable to determine, during the test mode, a current measurement of the pulse laser diode array.

13 Claims, 4 Drawing Sheets

(51) Int. Cl.
  *G01S 7/497* (2006.01)
  *H01S 5/00* (2006.01)
  *G01R 31/26* (2020.01)
  *H01S 5/042* (2006.01)
  *H01S 5/40* (2006.01)

(52) U.S. Cl.
  CPC ........ *G01R 31/2635* (2013.01); *H01S 5/0428* (2013.01); *H01S 5/4025* (2013.01)

(56) References Cited

U.S. PATENT DOCUMENTS

| | | |
|---|---|---|
| 2007/0008665 A1* | 1/2007 | Moyer .................. H05B 47/20 361/42 |
| 2011/0091207 A1 | 4/2011 | Xie et al. |
| 2012/0224598 A1 | 9/2012 | Brown et al. |
| 2015/0327338 A1 | 11/2015 | Hui et al. |
| 2021/0131865 A1* | 5/2021 | Yang ........................ H03F 3/087 |
| 2022/0074975 A1* | 3/2022 | Akbari-Dilmaghani ..................... H01S 5/0428 |

FOREIGN PATENT DOCUMENTS

| | | |
|---|---|---|
| JP | H0918412 A | 1/1997 |
| JP | H09116231 A | 5/1997 |
| JP | 2001168454 A | 6/2001 |
| JP | 2001352122 A | 12/2001 |

\* cited by examiner

CIRCUIT FAILURE DETECTION FOR DIODE ARRAYS

RELATED APPLICATIONS

The present invention is a U.S. National Stage under 35 USC 371 patent application, claiming priority to Serial No. PCT/EP2019/084091, filed on 6 Dec. 2019; which claims priority of U.S. Provisional Application Ser. No. 62/782,067, filed on 19 Dec. 2018; and U.S. Provisional Application Ser. No. 62/825,395, filed on 28 Mar. 2018, the entirety of which are incorporated herein by reference.

BACKGROUND

Light detection and ranging (LiDAR) systems are based on direct time-of-flight (DTOF) and are used in spacecraft navigation, assembly-line robotics, augmented and virtual reality (AR/VR), (drone-based) surveillance, advanced driver assistance systems (ADAS), and autonomous cars. High speed sensing of the pulsed laser diode current is required for eye safety in LiDAR applications. A LiDAR sensor can include an optical remote sensing module that can measure the distance to a target or objects in a scene, by irradiating the target or scene with light, using pulses (or alternatively a modulated signal) from a laser, and measuring the time it takes photons to travel to said target or landscape and return after reflection to a receiver in the LiDAR module. The reflected pulses (or modulated signals) are detected, with the time of flight and the intensity of the pulses (or modulated signals) being measures of the distance and the reflectivity of the sensed object, respectively.

Conventional LiDAR sensors utilize mechanically moving parts for scanning laser beams. In some systems, including certain systems used in automotive applications, such as advanced driver assist systems (ADAS) and autonomous driving systems, it is preferred to use solid state sensors for a variety of potential advantages including but not limited to higher sensor reliability, longer sensor lifetime, smaller sensor size, lower sensor weight, and lower sensor cost.

Radio frequency (RF) delay lines used for the creation of radar phased arrays were used several decades ago for the solid state steering of radar signals. Photonic integrated circuit (PIC) based delay lines combined with detectors and RF antenna arrays were used two decades ago to improve the precision of delays in the solid state steering of radar signals. PICs with microscale and nanoscale devices can be used to produce optical phased arrays (OPAs), comprising tunable optical delay lines and optical antennas, for the solid state steering of laser beams. Phased arrays can be complex, costly and/or have a different purpose than beam forming and beam steering.

SUMMARY

This specification describes an arrangement relating to fast and efficient short-open fault detection in the pulsed laser diode array employed in LiDAR applications. During fault detection mode it monitor laser diode current using low voltage complementary metal-oxide-semiconductor (CMOS) devices, which offer more accuracy and are efficient in terms of power and die area.

In general, one innovative aspect of the subject matter described in this specification can be embodied in a sensor arrangement for current sensing and temperature sensing when two laser diodes current sensed simultaneously. The arrangement including a diode array, a diode array test circuit electrically coupled to the diode array and operable to perform circuit failure detection during a test mode when a test input voltage is applied, the diode array test circuit including an input resistor operable to traverse a test current from the diode array, the diode array electrically coupled to a bottom end of the input resistor, an input voltage node, wherein a top end of the input resistor is electrically coupled to the input voltage node, a buffered amplifier including an amplifier including an inverting input electrically coupled to a first input of the buffered amplifier circuit and the input voltage node, and a noninverting input electrically coupled to the test input voltage, and a plurality of amplifier circuit switches, wherein at least one amplifier circuit switch is electrically coupled to an output of the amplifier, wherein at least one amplifier circuit switch is electrically coupled to an output of the buffered amplifier circuit, and a current detector electrically coupled to the output of the buffered amplifier circuit and operable to determine, during the test mode, a current measurement of the diode array.

Some implementations include one or more of the following features.

In some implementations, the current detector includes an analog-to-digital converter (ADC) electrically coupled to the output of the buffered amplifier circuit and operable to convert an analog output from the buffered amplifier circuit to a digital output signal, and a digital signal processing (DSP) unit electrically coupled to an output of the ADC and operable to detect, from the digital output signal, a circuit failure of the diode array. In some implementations, the digital output signal is indicative of a test photocurrent generated by the diode array during the test mode.

In some implementations, circuit failure detection includes detecting an open circuit failure. In some implementations, circuit failure detection includes detecting a short circuit failure.

In some implementations, the diode array is a pulse laser diode array and electrically coupled to a laser driver, wherein the laser driver is on during an operation phase, and is off during the test mode.

In some implementations, the diode array test circuit further includes a first input switch electrically coupled to the input voltage node and the inverting input of the amplifier at a first input of the buffered amplifier circuit, and a second input switch electrically coupled to the input voltage node and an amplifier circuit switch at a second input of the buffered amplifier circuit. In some implementations, the first input switch and the second input switch are configured to switch to an on state during the test mode to allow the test current to flow to the buffered amplifier circuit. In some implementations, the first input switch and the second input switch are configured to switch to an off state during an operation phase to prevent an operation current to flow from the diode array to the buffered amplifier circuit, wherein during the operation phase, DC input voltage is pulsed by a laser driver to the diode array. In some implementations, the first input switch and the second input switch are high voltage devices. In some implementations, the diode array test circuit further includes a second input resistor electrically coupled to the input voltage node and the first input switch, and a third input resistor electrically coupled to the input voltage node and the second input switch.

In some implementations, the plurality of amplifier circuit switches comprises at least one low voltage switch and at least one high voltage switch.

In some implementations, the current detector is further operable to determine that the current measurement of the diode array indicates a level of failure by determining whether the current measurement exceeds a failure threshold by comparing the current measurement of the diode array to a measured current of a reference diode array.

In general, one innovative aspect of the subject matter described in this specification can be embodied in a method for circuit failure detection including applying, during a test mode of a diode array, a test input voltage to an amplifier of buffered amplifier circuit located in a diode array test circuit electrically coupled to the diode array, detecting, by a current detector electrically coupled to an output of buffered amplifier circuit, an output signal from the output of the buffered amplifier circuit, determining, by the current detector and based on the output signal, a test current of the diode array, and determining, by the current detector, whether the test current indicates a level of failure of the diode array that exceeds a failure threshold.

Some implementations include one or more of the following features.

In some implementations, the level of failure indicates that a particular percentage of diodes in the diode array have failed.

In some implementations, the diode array test circuit includes an input resistor operable to traverse a test current from the diode array, the diode array electrically coupled to a bottom end of the input resistor, an input voltage node, wherein a top end of the input resistor is electrically coupled to the input voltage node, and a plurality of amplifier circuit switches, wherein at least one amplifier circuit switch is electrically coupled to an output of the amplifier, wherein at least one amplifier circuit switch is electrically coupled to an output of the buffered amplifier circuit. In some implementations, the plurality of amplifier circuit switches comprises at least one low voltage switch and at least one high voltage switch. In some implementations, the amplifier includes an inverting input electrically coupled to a first input of the buffered amplifier circuit and the input voltage node, and a noninverting input electrically coupled to the test input voltage.

In some implementations, the diode array test circuit further includes a first input switch electrically coupled to the input voltage node and the inverting input of the amplifier at a first input of the buffered amplifier circuit, and a second input switch electrically coupled to the input voltage node and an amplifier circuit switch at a second input of the buffered amplifier circuit. In some implementations, the first input switch and the second input switch are configured to switch to an on state during the test mode to allow the test current to flow to the buffered amplifier circuit. In some implementations, the first input switch and the second input switch are configured to switch to an off state during an operation phase to prevent an operation current to flow from the diode array to the buffered amplifier circuit, wherein during the operation phase, DC input voltage is pulsed by a laser driver to the diode array. In some implementations, the first input switch and the second input switch are high voltage devices.

In some implementations, the diode array test circuit further includes a second input resistor electrically coupled to the input voltage node and the first input switch, and a third input resistor electrically coupled to the input voltage node and the second input switch.

In some implementations, the current detector includes an analog-to-digital converter (ADC) electrically coupled to the output of the buffered amplifier circuit and operable to convert an analog output from the buffered amplifier circuit to a digital output signal, and a digital signal processing (DSP) unit electrically coupled to an output of the ADC and operable to detect, from the digital output signal, a circuit failure of the diode array, wherein the digital output signal is indicative of a test photocurrent generated by the diode array during the test mode.

In some implementations, the diode array is a pulse laser diode array and electrically coupled to a laser driver, wherein the laser driver, during an operation phase, pulses a DC input voltage to the diode array, wherein, during the test mode, the laser driver is an off state.

In some implementations, the failure threshold is determined by detecting a current level of a reference laser diode array.

Some embodiments of the subject matter described in this specification can be implemented so as to realize one or more of the following advantages. With LIDAR applications, circuit arrangements are under various stress conditions (e.g., very high current and large voltage transients), and therefore various short and open circuit failure modes have been observed. The disclosed testing circuit arrangement and method described herein enables a testing circuit arrangement to detect and locate failed diodes in a diode array. Additionally, this technique is useful to benefit from the availability of power switches that permits high voltages e.g., 25V.

Compact, low-cost, Q-switched diode-pumped solid-state lasers (DPPS) with high pulse energy are needed for many applications, such as laser range finders, laser designators, laser breakdown spectroscopy, and laser ignition. In many of those applications, the lasers need to operate at high temperatures where typical edge-emitting laser diode pump lasers show poor reliability. High power vertical-cavity surface-emitting laser (VCSEL) arrays have been demonstrated as excellent pump sources for diode-pumped solid-state lasers. Their key advantages over the existing edge-emitter technology include simpler coupling optics, reduced wavelength sensitivity to temperature, and increased reliability, especially at high temperatures, low-cost manufacturing, and two-dimensional planar scalability. VCSELs are an attractive candidate for IR illumination applications as they offer advantageous properties such as efficiency, intrinsically low diverging circular beam, low-cost manufacturing, narrow emission spectrum, and high reliability. VCSELs can also operate at high temperatures, thereby meeting the harsh environmental requirements of many illuminators. The efficiency and brightness of these VCSELs also reduce the requirements of the power supply compared to, for example, an LED approach. These features make VCSEL technology very well suited for constructing low-cost DPSS lasers with high pulse energy. VCSELs can be used in illuminators emitting from a few watts up to several hundred watts. The testing circuits described herein are able to detect and locate the failed diodes in the diode array used within VCSEL technology.

The arrangements described herein allows the core current sensing blocks to be shared between different laser diode arrays, which offers more accuracy and efficiency in terms of die area.

The details of one or more embodiments of the subject matter described in this specification are set forth in the accompanying drawings and the description below. Other aspects, features, and advantages will become apparent from the description, the drawings, and the claims.

BRIEF DESCRIPTION OF THE DRAWINGS

Like reference numbers and designations in the various drawings indicate like elements.

DETAILED DESCRIPTION

This disclosure describes an example pulsed laser diode testing circuit apparatus that enables open-short circuit failure detection in the diode array. Pulsed laser diode current in LIDAR application is required for eye safety in LIDAR applications. During the life of a high power diode laser, several events may occur that have undesirable consequences. For example, the performance of the laser may decline to such an extent that it adversely affects the overall performance of the system. In such situations it is typically useful to detect the onset of such a decline, thereby allowing the defective laser to be replaced or other measures taken. Alternately, if a diode laser undergoes an open circuit failure, for example, due to de-lamination or bond failure, and assuming that the diode laser in question is one of an array in which the lasers utilize a serial electrical connection, the open circuit failure can lead to the whole system losing current. Alternately if a diode laser undergoes a short circuit failure, for example due to cracking in the laser bar, adjacent lasers as well as adjacent system components may be severely damaged.

The circuit arrangement described in this document relies on scaled down current-voltage through and across a diode array to check the health of the diode array by checking for circuit failures. Additionally, the example pulsed laser diode testing circuit apparatus includes an integrated laser-diode driver for LIDAR applications required to be implemented in high voltage CMOS technologies to combat significant voltage drop associated with parasitic inductances. Checking the health of the diode array enables the ability to use reliable and more accurate low voltage devices for measurement and characterization. Due to the high current of these applications, it may not be feasible to determine which specific diode as failed in a large diode array (e.g., 128 diodes, or more), however, the circuit arrangement described herein can determine, based on the current calculations, that a particular percentage of diodes have failed (e.g., >20%). The circuit manufacturer can determine what percent level of failed diodes would determine based on that failure threshold. For example, if the failure threshold is set at greater than or equal to 20%, or if the failure threshold is surpassed, then a number of diodes have failed that the entire array would be considered as a failed array. For example, if the circuit arrangement determines that at least 30 diodes have failed in a 128 diode array (i.e. 23.4%) based on the current measurement, then the diode array would be considered to have failed.

Additionally, the example pulsed laser diode testing circuit apparatus described herein can benefit from availability of high voltage switches. For example, high peak current range up to 5-10 A with a corresponding fast rise-time of 1 ns or less, a fall-time of 2 ns, and a pulse duration of 3-20 ns. Thus, the proposed apparatus and method described herein can scale down very high junction voltages of laser diode array, and consequently to use available low voltage CMOS devices, which are more accurate and efficient in terms of power and die area.

Under various stress conditions (e.g., very high current and large voltage transients) the short and open circuit failure modes have been observed in laser diodes with the circuit arrangement described herein. For example, the diode voltage can rise to high voltage levels (e.g., 20V-30V) as result of very fast and short high current (e.g., 6 A-10 A) pulses. This document describes an arrangement that optimizes an arrangement to detect and locate the failed diodes in the diode array when the laser driver is turned off (e.g. the input voltage source, such as a laser driver, is turned off). Additionally, a circuit arrangement described herein allows the ability to simultaneously process the measurement for two diode arrays differentially at the same time to account for temperate variation of the diodes current.

Additionally, this document describes an arrangement that optimizes a circuit arrangement with low complexity in terms of required die are which is important for realization of N×N VCSEL arrays required in LIDAR applications, because it has been shown that high power and many short pulses are needed for time of flight applications.

These features, as well as additional features, are described in more detail below.

Figure 1:
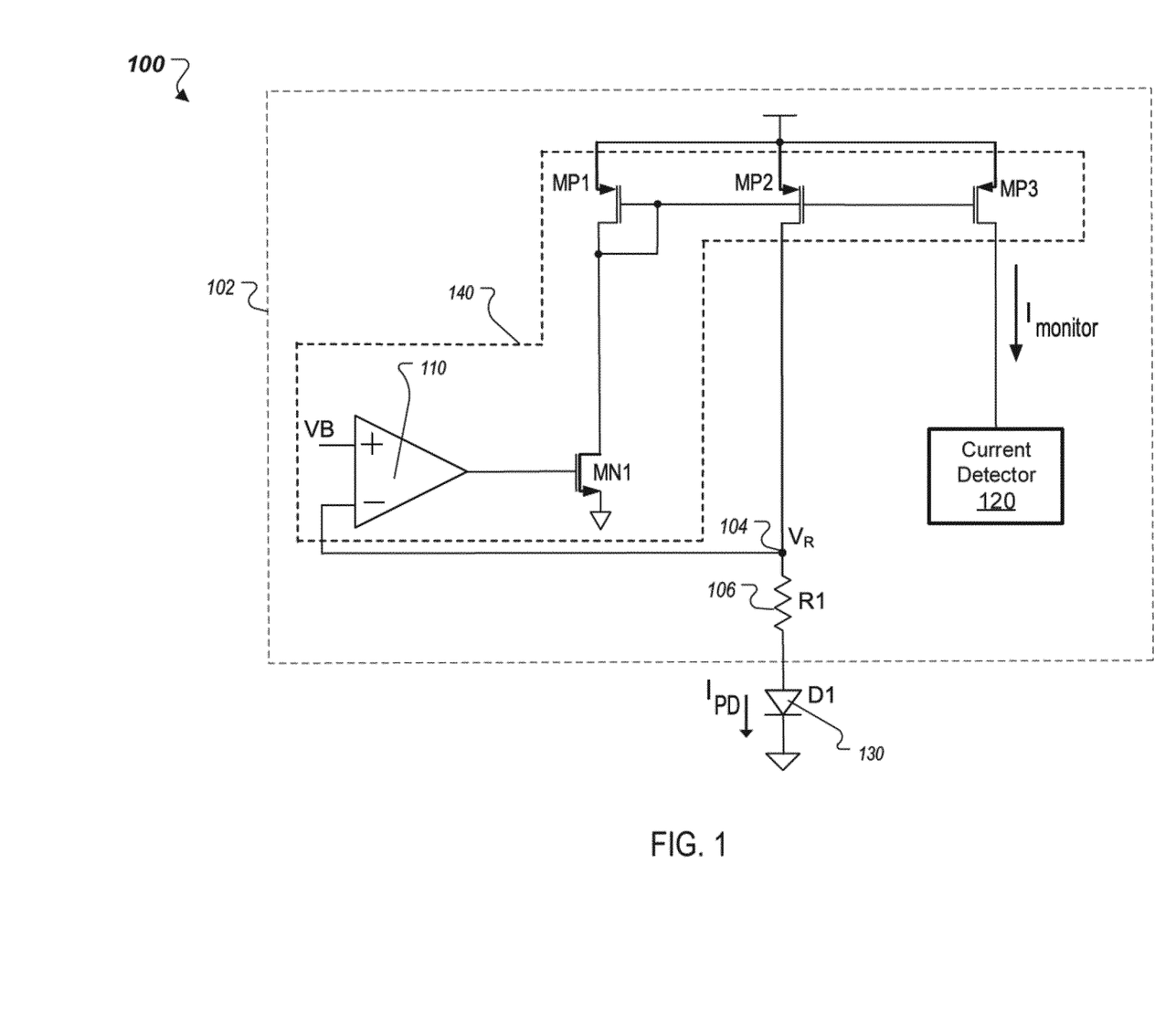
FIG. 1 is an example implementation of a diode testing circuit apparatus.

FIG. 1 is an example implementation of a circuit diagram of a testing circuit arrangement 100. The testing circuit arrangement 100 includes a diode array test circuit 102 electrically coupled to a diode 130, as shown. The testing circuit arrangement 100 is operable, during a failure detection mode (also referred to herein as a "test mode"), to detect open-short circuit failure in the diode 130. These components may be implemented as an integrated circuit. In some embodiments, the testing circuit arrangement 100 is used as a LiDAR system.

The diode array test circuit 102 includes an input resistor (R1) 106, an input voltage node (VR) 104, a buffered amplifier circuit 140, and a current detector 120. In some implementations the current detector 120 is included in the diode array test circuit 102, as shown. Alternatively, the current detector 120 is a separate component of the diode array test circuit 102. Additionally, the current detector 120 can monitor current from more than one diode array test circuit 102, further described below in FIG. 4.

The buffered amplifier circuit 140 includes an amplifier 110 and a plurality of switches (e.g., MN1, MP1, MP2, and MP3 as shown in FIG. 1). In some implementations, the switches (MN1, MP1, MP2, and MP3) are MOSFETS. Each switch includes a first terminal, a second terminal, and a third terminal, and the third terminal of the first switch receives a control signal that places the first switch in either a closed state in which a conduction path is established between the first and second terminals, or an open state in which the conduction path is eliminated between the first and second terminals. In some implementations, each switch operates at a magnitude limit for the switching voltage of substantially half of the DC input voltage.

The amplifier 110 includes an inverting input electrically coupled to the input voltage node 104, a noninverting input electrically coupled to an input voltage (VB), and an output electrically coupled to the switch MN1. The input voltage node 104 is electrically coupled to the inverting input of the amplifier 110, to one end of the input resistor (R1) 106, and to the switch MP2 in the buffered amplifier circuit 140.

The current detector 120 is operable to receive analog signals from the buffered amplifier circuit 140 to calculate a current value. The current detector 120 is operable to determine if the diode 130 has failed, based on the detected current levels. For example, the current detector can detect short and open circuit failures. In some implementations, the current detector can include an analog to digital converter (ADC) and a digital signal processing (DSP) unit, further described below in FIG. 3. In some implementations, other current detection components or circuits can be used.

The diode 130 is electrically coupled to the input resistor 106 of the diode array test circuit 102. The diode 130 generates a photo-current $I_{PD}$. The photocurrent $I_{PD}$ flows through the photodiode 130, and to the diode array test circuit 102 through the input resistor (R1) 106, to the buffered amplifier circuit 140, to the current detector 120. The input resistor 106 is operable to traverse pulsed laser current to the diode 130. Because of the closed loop arrangement of the buffered amplifier circuit 140, switch MP1 and switch MP2 forces the input node voltage VR to equal the input voltage VB. Therefore, the test current $I_{monitor}$ as measured by the current detector 120 from the switch MP3 of the diode array test circuit 102 is inversely proportional to the input resistor (R1) 106 and proportional to effective area of the diode 130. The test current $I_{monitor}$ can be calculated by the equation:

$$I_{monitor} = \frac{V_R - V_{diode}}{R1} \text{ where } V_R = V_B$$

Figure 2:
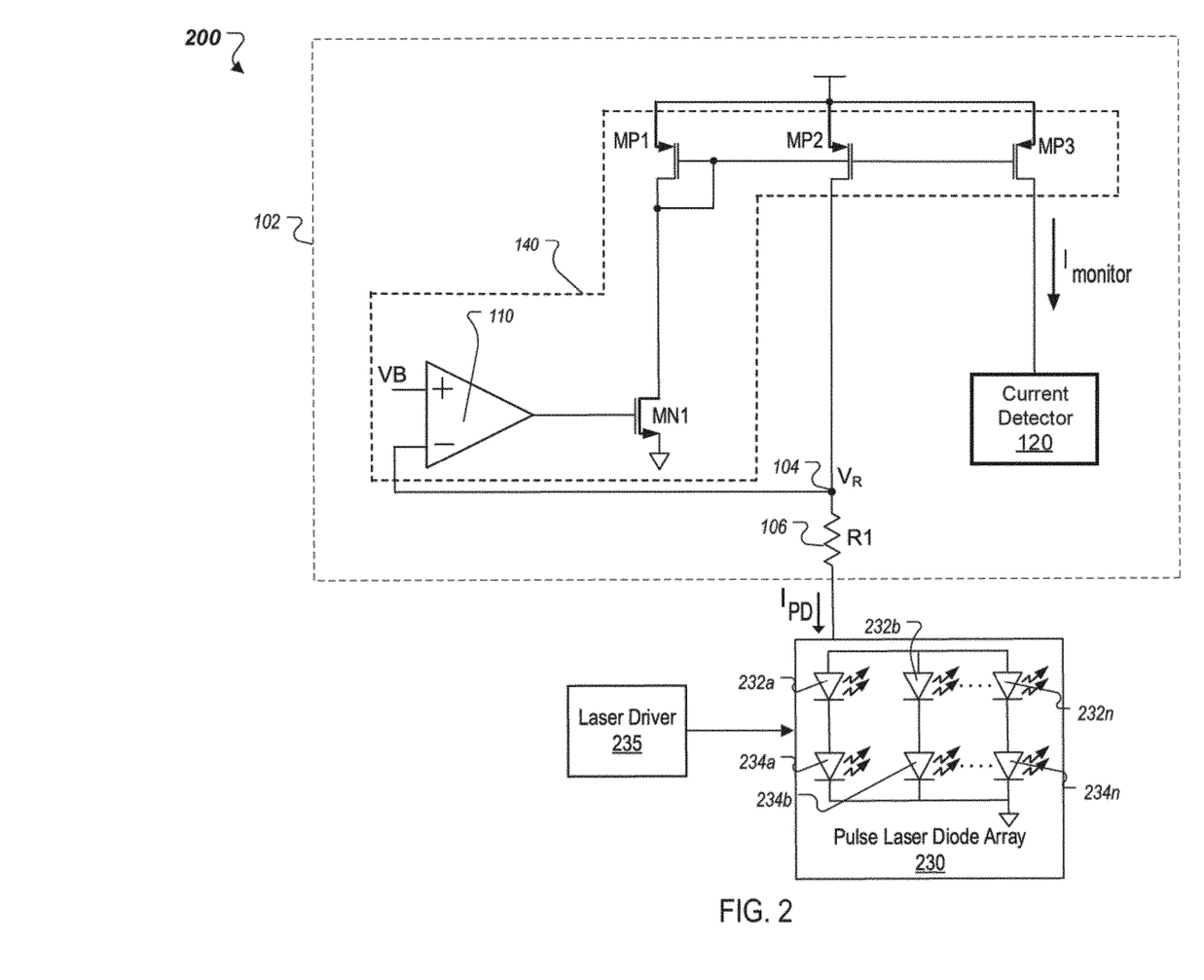
FIG. 2 is an example implementation of a pulsed laser diode testing circuit apparatus.

FIG. 2 is an exemplary implementation of a circuit diagram of a testing circuit arrangement 200. The testing circuit arrangement 200 has a topology similar to the testing circuit arrangement 100 shown in FIG. 1, except that pulse laser diode array 230 is electrically coupled to the diode array test circuit 102 instead of the diode 130 as shown in FIG. 1. The diode array test circuit 102 is further operable, during a test mode, to detect open-short circuit failure in the pulse laser diode array 230. In some embodiments, the testing circuit arrangement 200 is used as a LiDAR system.

The pulse laser diode array 230 is electrically coupled to the input resistor 106 of the diode array test circuit 102. The pulse laser diode array 230, as shown in FIG. 2, includes a plurality of photodiodes 232a, 232b, 232n, 234a, 234b, 234n, etc. (also referred to herein as photodiodes 232,234). The pulse laser diode array 230 generates a photo-current $I_{PD}$. The photocurrent $I_{PD}$ flows through each photodiode 232, 234, and the diode array test circuit 102 (e.g., through the input resistor 106, to the buffered amplifier circuit 140), to the current detector 120. The input resistor 106 is operable to traverse pulsed laser current to the pulse laser diode array 230.

As shown in FIG. 2, a DC input voltage is pulsed by a laser driver 235 and provided to the pulse laser diode array 230. The pulsed laser driver 235 is operable to pulse a DC input power from an input power supply (not shown). For example, the pulsed multi-channel system can provide peak current up to 10 A and a corresponding fast rise-time of 1 ns or less, and a pulse duration of 3 ns. In some implementations, the input pulses can have a different rise/fall time and pulse width modulations. For example, the rise/fall time may be anywhere from 600 ps to 2 ns, and the pulse width may be anywhere from 3 ns to 20 ns. In some implementations, the power supply for the laser driver 235 can be a range for the selected CMOS technology used. For example, the VDD input voltage of the power supply for the exemplary pulsed laser diode current sensing apparatus 200 shown in FIG. 2 can range from 20V to 25V.

As discussed for the testing circuit arrangement 100, the closed loop arrangement via the buffered amplifier circuit 140, switch MP1 and switch MP2 forces the input node voltage $V_R$ to equal the input voltage VB. Therefore, the test current $I_{monitor}$ through the switch MP3 of the diode array test circuit 102 is inversely proportional to the input resistor (R1) 106 and proportional to effective area of the pulse laser diode array 230, as discussed herein.

In some implementations, the pulse laser diode array 230 is connected to the integrated circuit as an external component. Alternatively, the pulse laser diode array 230 can be a part of the integrated circuit in some embodiments. The pulsed laser diode testing circuit apparatus can be considered a pulsed laser diode testing arrangement. In some embodiments, the pulsed laser diode current sensing arrangement is used as testing circuit for a LiDAR system.

Figure 3:
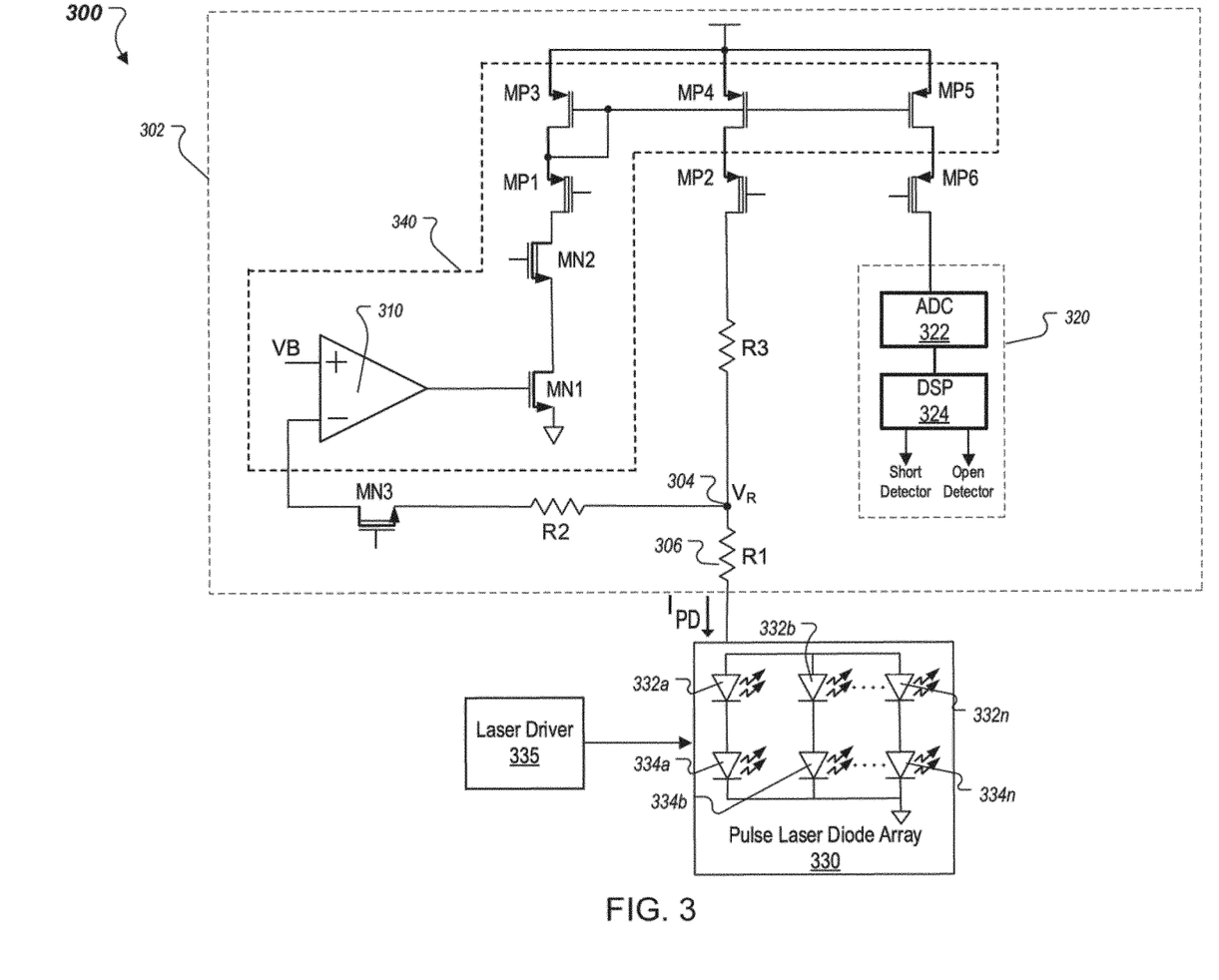
FIG. 3 is an example implementation of a pulsed laser diode testing circuit apparatus.

FIG. 3 is an exemplary implementation of a circuit diagram of a testing circuit arrangement 300. The testing circuit arrangement includes a diode array test circuit 302 electrically coupled to a pulse laser diode array 330, as shown. The diode array test circuit 302 is operable, during a test mode, to monitor the health of the pulse laser diode array 330 by detecting open-short circuit failures utilizing the current detector 320. These components may be implemented as an integrated circuit. In some embodiments, the testing circuit arrangement 300 is used as a LiDAR system.

The diode array test circuit 302 includes an input resistor (R1) 306, an input voltage node (VR) 304, a buffered amplifier circuit 340, and a current detector 320. In some implementations, and as shown in FIG. 3, the diode array test circuit 302 includes a secondary resistor R2, a tertiary resistor R3, and some additional switches (MN3, MP2, and MP6) located outside of the buffered amplifier circuit 340, which will be further discussed herein. In some implementations the current detector 320 is included in the diode array test circuit 302, as shown. Alternatively, the current detector 320 is a separate component of the diode array test circuit 302. Additionally, the current detector 320 can monitor current from more than one diode array test circuit 302, further described below in FIG. 4.

The buffered amplifier circuit 340 includes an amplifier 310 and a plurality of switches (e.g., MN1, MN2, MP1, MP3, MP4, and MP5 as shown in FIG. 3). Additionally, diode array test circuit 302 includes additional switches (e.g., MN3, MP2, and MP6) and resistors (e.g., R2 and R3). In some implementations, the switches (MN1, MN2, MN3, MP1, MP2, MP3, MP4, MP5, and MP6) are MOSFETS. Each switch includes a first terminal, a second terminal, and a third terminal, and the third terminal of the first switch receives a control signal that places the first switch in either a closed state in which a conduction path is established between the first and second terminals, or an open state in which the conduction path is eliminated between the first and second terminals. In some implementations, each switch operates at a magnitude limit for the switching voltage of substantially half of the DC input voltage.

The amplifier 310 includes an inverting input electrically coupled to the input voltage node 304 through the switch MN3 and secondary resistor R2, a noninverting input electrically coupled to an input voltage (VB), and an output electrically coupled to the switch MN1. The input voltage node 304 is electrically coupled to one end of the secondary resistor R2, to one end of the input resistor (R1) 306, and to the switch MP2 through the tertiary resistor R3.

The current detector 320 is operable to receive analog signals from the buffered amplifier circuit 340 through the switch MP6 to calculate a current value. The current detector 320 is operable to determine if the pulse laser diode array 330 has failed (open circuit or short), based on the detected current levels. For example, the current detector can check the health of the pulse laser diode array 330, such as detect short and open circuit failures during a test mode. The current detector 320 includes an analog to digital converter (ADC) 322 and a digital signal processing (DSP) unit 324.

The ADC 322 converts an analog signal to a digital signal. The ADC 322, as shown in FIG. 3, is electrically coupled to the switch MP6, which is connected to an output of the buffered amplifier circuit 340 through switch MP5. The ADC 322 receives the analog signals from switch MP6 and converts those analog signals to respective digital signals. The ADC 322 is electrically coupled to the DSP unit 324, and the ADC 322 is operable to send the respective digital signals to the DSP unit 324. In some implementations, the digital output signal from the ADC 322 is indicative of the photocurrent generated by the pulse laser diode array 330.

The DSP unit 324 is electrically coupled to the output of the ADC 322. The DSP unit 324 is operable to detect, from the received digital output signals from the ADC 322, the open-short circuit failure in the pulse laser diode array 330. For example, the DSP unit 324 analyzes the digital signals from the ADC 322, and can determine that pulse laser diode array 330 includes failed diodes. For example, if the DSP unit 324 determined that the current is less than a threshold current defined by a reference laser diode array (e.g., reference laser diode array 430b in FIG. 4, as further discussed herein), would be considered to have failed as an open detected circuit because 30% of diodes in the array are missing or not functioning properly. In another example, if the DSP unit 324 determined that the current is greater than a threshold current defined by the reference laser diode array, the laser diode array 330 would be considered to have failed as a short detected circuit as approximately 30% of diodes in the laser diode array 330 are missing or not functioning properly.

In operation, during a test mode, an operation mode or active mode for the pulse laser diode array 330 is turned off (e.g., the laser driver 335 is turned off) and a test voltage (VB) is applied to the amplifier 310 of the buffered amplifier circuit 340. For example, a DC input voltage is not being pulsed by the laser driver 335 to the diode array 330. In other words, the diode array test circuit 302 checks the health of the pulse laser diode array 330 when the pulse laser diode array 330 is not in use and the pulsed laser driver 335 is turned off. During normal operation (e.g., during an operation mode) of the pulsed laser array 330 (e.g., pulsed laser driver 335 is on and operational, and a DC input voltage is pulsed by the laser driver 335 to the diode array 330), the diode array test circuit 302 will be turned off using control switches MN2, MN3, MP1, MP2, and MP6. During the test mode, using the same control switches MN2, MN3, MP1, MP2, and MP6, the diode array test circuit 302 is turned on, and assesses the health of the pulsed laser array 330 by monitoring the current level through the current detector 320.

In some implementations, the amplifier 310 and switches MN1, MP3, MP4 and MP5 are low-voltage devices, and switches MN2, MN3, MP1, MP2, and MP6 are high voltages devices. In some implementations, the amplifier 310 and all of the switches are low-voltage devices. In some implementations, the secondary resistor R2 and the tertiary resistor R3 are not included. In the example implementation, as shown in FIG. 3, secondary resistor R2 and the tertiary resistor R3 are included as a voltage divider circuit with respect to the input voltage at the input voltage node (VR) 304.

In some implementations, for circuit failure detection of the pulse laser diode array 330 from the diode array test circuit 302 during the test mode (e.g., pulsed laser driver 335 is off), switches MP2 and MN3 will enable the buffered amplifier circuit 340 to be shared between diode array elements 332, 334 of the pulse laser diode array 330.

Figure 4:
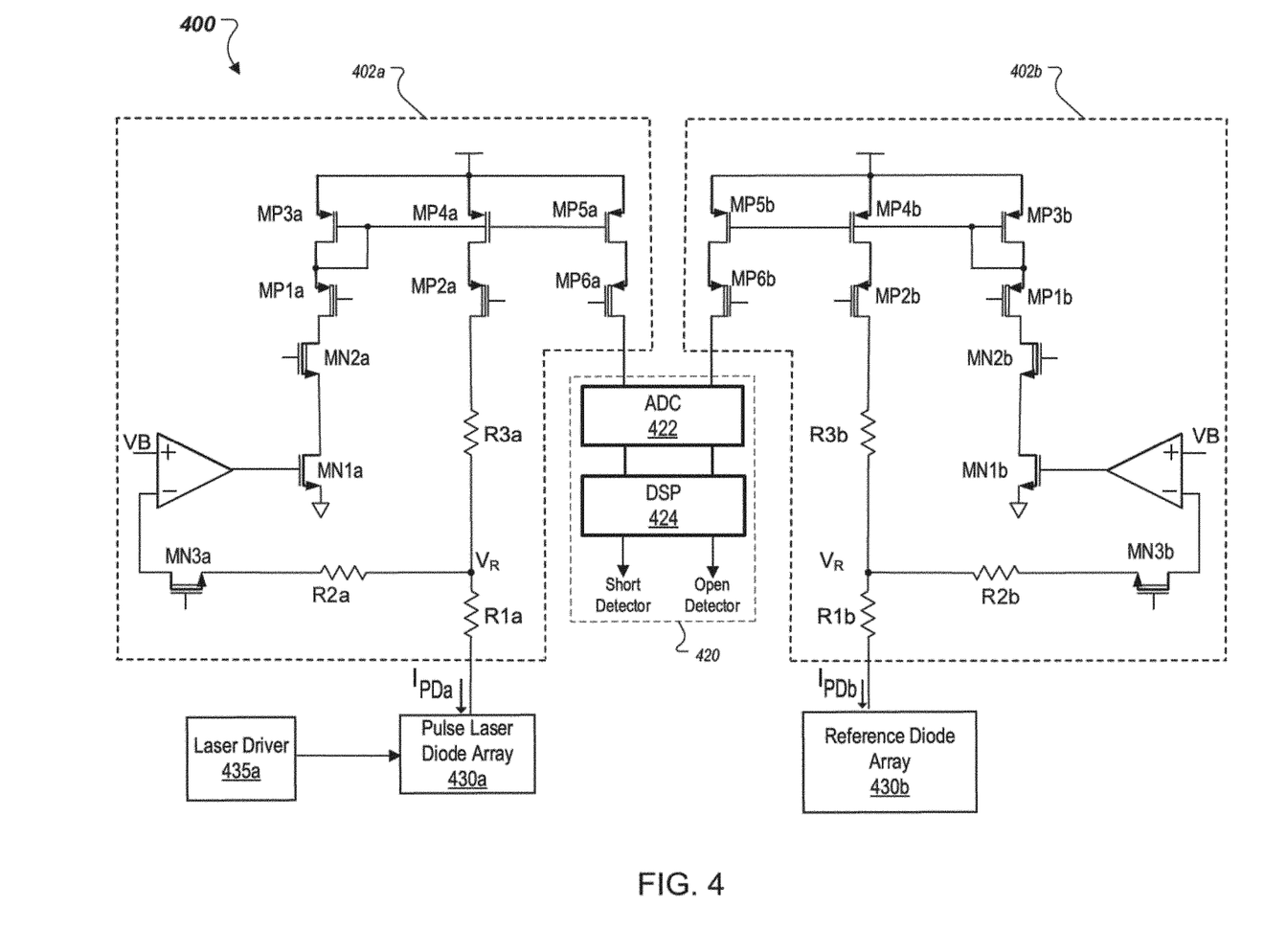
FIG. 4 is an example implementation of a pulsed laser diode testing circuit apparatus.

In some implementations, during operation of a test mode, a test input voltage is applied to the amplifier 310 of the buffered amplifier circuit 340 located in a diode array test circuit 302. Next, an output signal is detected by the current detector 320 from the output of the buffered amplifier circuit 340, where the output of the buffered amplifier circuit 340 is electrically coupled to an amplifier circuit switch and an additional output switch located outside of the buffered amplifier circuit 340. For example, as shown in FIG. 3, the output of the buffered amplifier circuit 340 is coupled to amplifier circuit switch MP5 and output switch MP6. The test mode continues with a test current of the diode array is determined by the current detector based on the output signal. Then, the current detector determines whether the test current indicates a level of failure of the diode array that exceeds a failure threshold. The diode array failure threshold can be determined by measuring the current of the reference laser diode array 430b.

FIG. 4 is an exemplary implementation of a circuit diagram of a testing circuit arrangement 400. The testing circuit arrangement includes two diode array test circuits 402a,b, each electrically coupled to a diode array 430a,b, respectively, and each diode array test circuits 402a,b, electrically coupled to the same current detector 420. However, in the example implementation shown in FIG. 4, diode array 430b is a reference diode array 430b. The reference diode array 430b is utilized to generate a reference current for comparison to the measure current of the diode array 430a. The reference laser diode arrays 430b is not subjected to a pulsed laser driver. These components may be implemented as an integrated circuit. In some embodiments, the testing circuit arrangement 400 is used as a LiDAR system.

Each of the diode array test circuits 402a,b are operable, during a test mode, to monitor the health of the respective pulse laser diode array 430 by detecting open-short circuit failures utilizing the current detector 420. The diode array test circuits 402a,b are similar to the diode array test circuit 302 in FIG. 3 except the current detector 420 is not included as a part of the test circuit, and is instead a separate component able to detect current from more than one diode array test circuit. As shown in FIG. 4, the current detector 420 is electrically coupled to diode array test circuits 402a,b. However, diode array test circuit 402b includes the reference diode array 430b. In some implementations, to consider a temperature effect, two diode arrays may be monitored at the same time. In operation, the current detector 420 monitors the current of the reference diode array 430b through test circuit 402b to determine a test failure threshold level, then the current detector 420 monitors the current of the diode array 430a through test circuit 402a to determine whether the test current from the diode array 430a exceeds a failure threshold as determined by the current measured by the reference diode array 430b. Alternatively, the current detector 420 monitors the current of pulse laser diode array 430a through test circuit 402a first, then the current detector 420 monitors the current of reference diode array 430b through test circuit 402b to determine whether the test current from the diode array 430a exceeds a failure threshold as determined by the current measured by the reference diode array 430b.

Additionally, or alternatively, the current detector can detect current levels from multiple different pulse laser diode arrays through multiple different diode array test circuits, where each respective diode array test circuit is connected to a different respective pulse laser diode array. In some implementations, a single diode array test circuit can be connected to multiple pulse laser diode arrays. Additionally, more than one reference diode array may be used to generate different reference currents for comparison to the one or more diode arrays that are being tested by the diode array test circuit.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus.

While this specification contains many specific implementation details, these should not be construed as limitations on the scope of any features or of what may be claimed, but rather as descriptions of features specific to particular embodiments. Certain features that are described in this specification in the context of separate embodiments also can be implemented in combination in a single embodiment. Conversely, various features that are described in the context of a single embodiment also can be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not necessarily be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous. Accordingly, other implementations are within the scope of the following claims.

What is claimed is:

1. An apparatus, comprising:
   a diode array;
   a diode array test circuit electrically coupled to the diode array and operable to perform circuit failure detection during a test mode when a test input voltage is applied, the diode array test circuit comprising:
   an input resistor operable to traverse a test current from the diode array, the diode array electrically coupled to a bottom end of the input resistor;
   an input voltage node, wherein a top end of the input resistor is electrically coupled to the input voltage node;
   a buffered amplifier circuit comprising:
   an amplifier comprising:
   an inverting input electrically coupled to a first input of the buffered amplifier circuit and the input voltage node; and
   a noninverting input electrically coupled to the test input voltage; and
   a plurality of amplifier circuit switches, wherein at least one amplifier circuit switch is electrically coupled to an output of the amplifier, wherein at least one amplifier circuit switch is electrically coupled to an output of the buffered amplifier circuit; and
   a current detector electrically coupled to the output of the buffered amplifier circuit and operable to determine, during the test mode, a current measurement of the diode array.

2. The apparatus of claim 1, wherein the current detector comprises:
   an analog-to-digital converter (ADC) electrically coupled to the output of the buffered amplifier circuit and operable to convert an analog output from the buffered amplifier circuit to a digital output signal; and
   a digital signal processing (DSP) unit electrically coupled to an output of the ADC and operable to detect, from the digital output signal, a circuit failure of the diode array.

3. The apparatus of claim 2, wherein the digital output signal is indicative of a test photocurrent generated by the diode array during the test mode.

4. The apparatus of claim 1, wherein circuit failure detection comprises detecting an open circuit failure.

5. The apparatus of claim 1, wherein circuit failure detection comprises detecting a short circuit failure.

6. The apparatus of claim 1, wherein the diode array is a pulse laser diode array and electrically coupled to a laser driver, wherein the laser driver is on during an operation phase, and is off during the test mode.

7. The apparatus of claim 1, wherein the diode array test circuit further comprises:
   a first input switch electrically coupled to the input voltage node and the inverting input of the amplifier at a first input of the buffered amplifier circuit; and
   a second input switch electrically coupled to the input voltage node and an amplifier circuit switch at a second input of the buffered amplifier circuit.

8. The apparatus of claim 7, wherein the first input switch and the second input switch are configured to switch to an on state during the test mode to allow the test current to flow to the buffered amplifier circuit.

9. The apparatus of claim 7, wherein the first input switch and the second input switch are configured to switch to an off state during an operation phase to prevent an operation current to flow from the diode array to the buffered amplifier circuit, wherein during the operation phase, DC input voltage is pulsed by a laser driver to the diode array.

10. The apparatus of claim 7, wherein the first input switch and the second input switch are high voltage devices.

11. The apparatus of claim 7, wherein the diode array test circuit further comprises:
   a second input resistor electrically coupled to the input voltage node and the first input switch; and
   a third input resistor electrically coupled to the input voltage node and the second input switch.

12. The apparatus of claim 1, wherein the plurality of amplifier circuit switches comprises at least one low voltage switch and at least one high voltage switch.

13. The apparatus of claim 12, wherein the current detector is further operable to determine that the current measurement of the diode array indicates a level of failure by determining whether the current measurement exceeds a failure threshold by comparing the current measurement of the diode array to a measured current of a reference diode array.

* * * * *